United States Patent
Shibuya

(10) Patent No.: US 6,188,620 B1
(45) Date of Patent: Feb. 13, 2001

(54) SEMICONDUCTOR MEMORY DEVICE HAVING A REDUNDANCY JUDGMENT CIRCUIT

(75) Inventor: Masahiro Shibuya, Kanagawa (JP)

(73) Assignee: NEC Corporation, Tokyo (JP)

( * ) Notice: Under 35 U.S.C. 154(b), the term of this patent shall be extended for 0 days.

(21) Appl. No.: 09/457,731

(22) Filed: Dec. 10, 1999

(30) Foreign Application Priority Data

Dec. 10, 1998 (JP) .................................... 10-350965

(51) Int. Cl.[7] ...................................................... G11C 7/00
(52) U.S. Cl. ............................................ 365/200; 365/233
(58) Field of Search .................................. 365/200, 233, 365/225.7

(56) References Cited

U.S. PATENT DOCUMENTS 5,267,205 * 11/1993 Hamada ................................. 365/200
5,434,439 * 7/1995 Hoshino ................................ 365/200

FOREIGN PATENT DOCUMENTS 6-150686    5/1994   (JP) .

* cited by examiner

Primary Examiner—Vu A. Le
(74) Attorney, Agent, or Firm—McGinn & Gibb, PLLC

(57) ABSTRACT

A semiconductor memory device includes a redundancy word driver to select a redundancy memory cell and a main word driver to select a normal memory cell, wherein it is judged on the basis of an address input whether a redundancy memory cell or a main word is selected and thereby, a time to drive a word line is shortened. In a redundancy judgment circuit, control signals RDC0 to activate redundancy word drivers and a control signal XDC to activate a main word driver are produced, by using dynamic NOR circuits and a dynamic AND circuit that can each set an initial state of an output signal thereof regardless of an input signal, wherein the control signals RDC and XDC in initial states are respectively set to levels at which the redundancy word drivers and main word driver are all inactive.

13 Claims, 9 Drawing Sheets

SEMICONDUCTOR MEMORY DEVICE HAVING A REDUNDANCY JUDGMENT CIRCUIT

BACKGROUND OF THE INVENTION

1. Field of the Invention

The present invention relates to a semiconductor memory device having a redundancy judgment circuit and especially, to a semiconductor memory device having a redundancy judgment circuit that replaces a main memory cell with a redundancy memory cell at a high speed.

2. Description of the Prior Art

A redundancy judgment circuit is especially used for replacement of a defective cell in a memory such as a dynamic RAM.

In the prior art, when in replacement of a defective cell, in order to prevent a multi-word mode in which a main word line and a redundancy word line are simultaneously activated from occurring, activation of a main word line is delayed till it is definitely determined whether or not a redundancy word line is used, whereas in recent years, a high speed has been demanded in operation during which an address is supplied to a semiconductor memory device and subsequent to this, data stored in a memory cell is read out based on the address.

A circuit configuration according to a conventional technique is shown in FIG. 7 and a waveform timing chart of the circuit is shown in FIG. 8.

First, address signals A0 to Aj are externally supplied to address judgment circuits 10 to 13. Herein, an address signal AjN is a complementary signal of a signal AjT. In the address judgment circuit 10, the address signal inputs A0 to Aj are compared with an address that is programmed with fuses in the address judgment circuit 10 and, when in coincidence, a judgment signal AC0 retains a high level with no extraction of a charge (a solid line of AC0 of FIG. 8), while, when not in coincidence, the judgment signal AC0 goes low with extraction of a charge (a broken line of AC0 of FIG. 8).

In the other address judgment circuits 11 to 13 as well, similar to the address judgment circuit 10, comparisons regarding the addresses are conducted and comparative results are output as address judgment signals AC1 to AC3.

Then, description will be made regarding operations of a redundancy judgment circuit 230. The redundancy judgment circuit 230 is configured by: AND circuits 231 and 232; latch circuits 233 and 234; and a NOR circuit 235.

In initial states, the latch circuits 233 and 234 output redundancy word control signals RDC0 and RDC1 at a low level. Therefore, the redundancy judgment circuit 230 in an initial state outputs a main word control signal XDC at a high level. That is, in the initial state, redundancy word drivers 40 and 41 are inactive, while a main word driver is active. Further, inverted signals of the judgment signals AC0 and AC1 are input to the AND circuit 231, while inverted signals of the judgment signals AC2 and AC3 are input to the AND circuit 232.

The latch circuits 233 and 234 receive outputs of the AND circuits 231 and 232 in response to a clock signal CLK1 provided in a predetermined timing. The outputs of the latch circuits 233 and 234 show whether or not a redundancy word line is used. Further, the outputs of the latch circuits 233 and 234 are output to the NOR circuit 235 and a control signal XDC for a main word line is output from the NOR circuit 235.

When the judgment signal AC0 is high and the other signals AC1 to AC3 are low, an output of the AND circuit 231 goes low, while a control signal RDC0 output from the latch circuit 233 goes high in response to the clock signal CLK1 and is input to the redundancy word driver 40. Further, the control signal RDC0 is input to the NOR circuit 235, and the control signal XDC changes from a high level to a low level and is input to the main word driver 50 (a solid line of XDC of FIG. 8).

On the other hand, when the judgment signals AC0 to AC3 all are low, outputs of the AND circuits 231 and 232 go high. Hence, the control signals RDC0 and RDC1 are input to the redundancy word drivers 40 and 41, while both remaining low. Further, the control signal XDC output from the NOR circuit 235 is input to the main word driver 50, while remaining high (a broken line of XDC of FIG. 8).

The redundancy word drivers 40 and 41 and the main word driver 50 are inactive or active when the control signals RDC0 and RDC1, and the control signal XDC are low or high, wherein when a control signal goes high, and the corresponding word driver is activated and drives a word line.

Then, description will be made regarding to operations of address latch circuitry 30. The address latch circuitry 30 is configured by latch circuits in the same number as the number of bits of an address and latches the address signals A0 to Aj in response to a clock signal CLK2, is reset with a reset signal in initial state. Herein, the clock signal CLK2 is produced by delaying the clock signal CLK1 by a time Δt through a delay circuit 60. The address latch circuitry 30 outputs the latched address, which is decoded by the address decoder 31, to the main word driver 50 as selected address signal ASEL.

If, at this time, a judgment has not been made on whether a redundancy word line or a main word line is used, there arises a risk to activate both word lines together. That is, when the address latch circuitry 30 latches the address signals A0 to Aj in response to the clock signal CLK1, the selected address signal ASEL is generated in a timing shown with a dashed line of ASEL of FIG. 8. As described above, since an initial value of the control signal XDC is high, when the selected address signal ASEL is generated, there arises a risk that a main word line Main Word is driven by the main word driver 50. Hence, the clock signal CLK2 has been delayed from the clock signal CLK1 sufficiently. When a main word line is used according to a judgment result, a total delay time is the sum of the delay time Δt and a delay time during which, in response to the clock signal CLK2, the address latch circuit 30 latches the address signals A0 to Aj and outputs the selected address signal ASEL. Accordingly, the delay times become a fault to slow the operation of the memory device as whole.

In order to cope with this fault, a proposal has been made, for example, as disclosed in Japanese Patent Laid-Open No. 6-150686, in which controls of a redundancy word line and a main word line are absolutely separated. The method disclosed in this prior art reference is as shown in FIG. 9.

That is, in address judgment circuits 130 to 133, when an address signals A0 to Aj input has no coincidence with a redundancy address programmed with fuses, all of judgment signals FUSE0 to 3 go low and therefore, an AND circuit 140 outputs a control signal NEN at a high level. On the other hand, OR circuits 141 and 142 output control signals SPE0 and SPE1 at low levels.

Further, for example, when the address signals A0 to Aj input coincide with a redundancy address in the address judgment circuit 130, the judgment signal FUSE0 goes low and the judgment signals FUSE1 to FUSE3 go high. Accordingly, the AND circuit 140, OR circuit 141 and OR circuit 142 output judgment signals at a low level, a high level and a low level respectively.

However, this circuit has a configuration that cannot flexibly correspond to a change in address judgment circuits, especially increase in circuit scale thereof. That is, since controls of the redundancy word line and main word line are separated, when the number of the address judgment circuits (130 to 133) increases in order to deal with many of redundancy addresses, there arises a fault, since the AND circuit 140 for controlling a main word line is slowed in operation due to increase in number of input signals, which further delays the operation of a control signal NEN that serves as an enabling signal for a normal word line driver 153. Furthermore, there arises another fault, since as the number of address judgment circuits increases, scales of control circuits for a redundancy word line and a main word line both increase.

As described above, in the conventional technique shown in FIG. 7, when latch of an address signal is delayed by a delay circuit in order to prevent a multi-word mode, a requirement is to have a sufficient length of delay time in the delay circuit. That is, as apparent from FIG. 8, a delay time Δt is necessary to be equal to or more than a time from a rise of the clock signal CLK1 to determination of a level of a redundancy word line Red.Word. Besides, when a main word line is driven according to a judgment result, there is a requirement for another delay time during which after the judgment result is determined, an address latch signal takes in an address and the address is supplied to a main word driver. Therefore, there arises a fault since the operation of the device is slowed down as a whole.

Further, there arises still another fault since, in a circuitry shown in FIG. 9 in which all judgment results of the address judgment circuits are input to a single AND circuit to determine whether or not a main word line is selected, as the number of address judgment circuits increases, the operation of the AND circuit is slowed, which in turn, makes the operation of the device slowed as a whole.

SUMMARY OF THE INVENTION

An object of the present invention is to provide a novel semiconductor memory device having a redundancy judgment circuit.

A further object of the invention is to provide a technique by which redundancy judgment is performed at a higher speed without any loss in a conventional function to prevent a multi-word mode from occurring.

The present invention relates to control of a semiconductor memory device having main memory cells and redundancy memory cells for defect relief in the memory cells when in activation of a memory cell and is characterized in that in activation of a memory cell, control is performed employing an initial state in which neither a normal main memory cell nor a redundancy memory cell is used.

The control has conventionally has been performed in such a manner that an initial state of a redundancy judgment circuit is, for example, such that a main memory cell is normally used and the main memory cell is activated by an output of the address judgment circuit while maintaining the redundancy judgment circuit in the initial state, or alternatively a redundancy memory cell is activated while the main memory cell is deactivated. On the other hand, in the present invention, the initial state of the redundancy judgment circuit is such that neither a main memory cell nor a redundancy memory cell is normally used. The redundancy judgment circuit executes control under which, by an output of the address judgment circuit, a main memory cell is activated, or alternatively a redundancy memory cell is activated.

Hence, according to the present invention, a delay of an address signal due to waiting for completion of redundancy judgment, in order that a plurality of memory cell activation signals are not simultaneously activated, can be eliminated and thereby, selection of a main memory cell or a redundancy memory cell can be effected at a high speed.

These and other objects of the present invention will be apparent to those of skill in the art from the appended claims when in light of the following specification and accompanying figures.

DETAILED DESCRIPTION OF THE PREFERRED EMBODIMENTS

Figure 1:
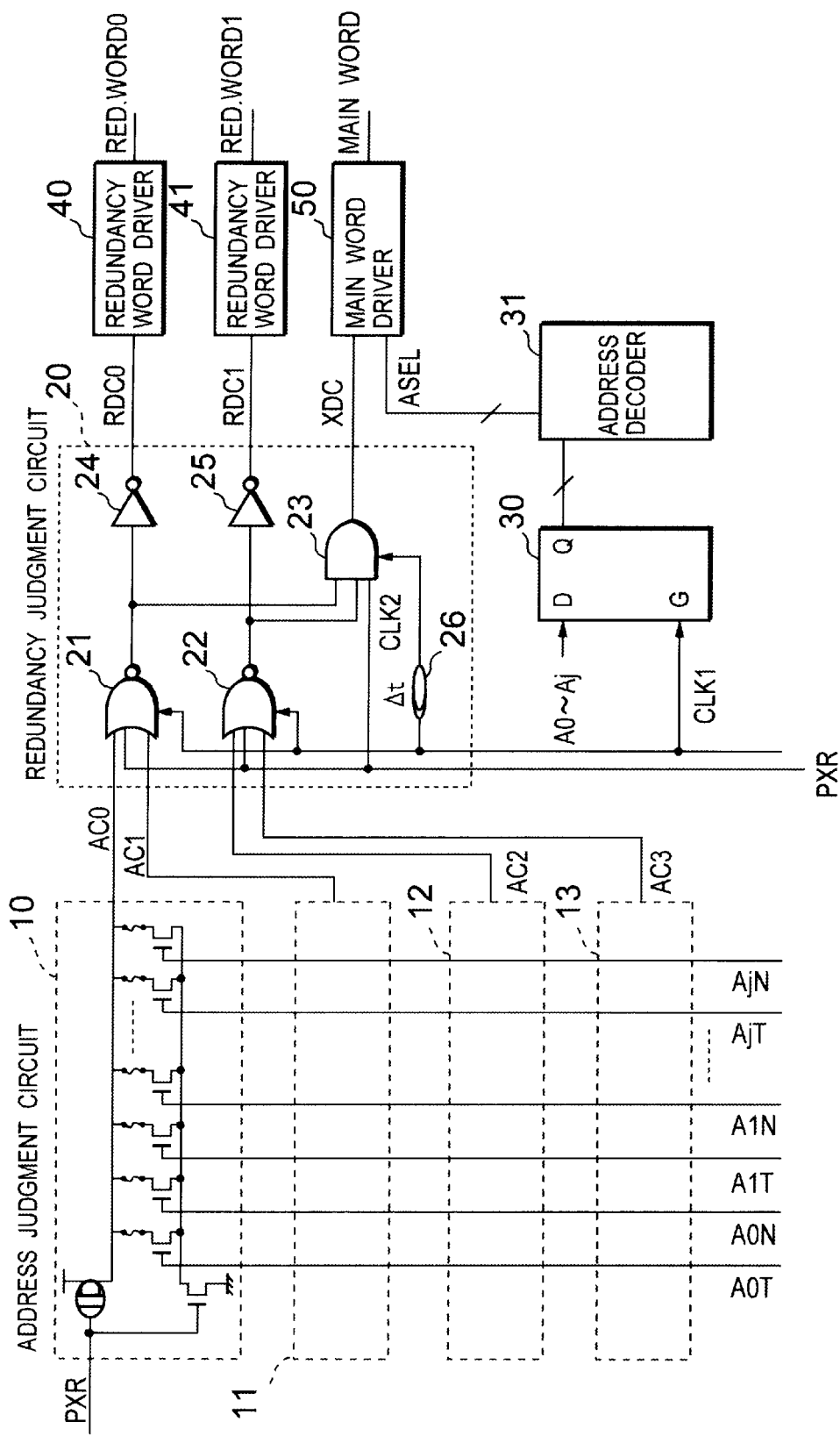
FIG. 1 is a diagram showing a configuration of circuitry of a first embodiment of the present invention.

The preferred embodiments of the present invention will be described in detail here in after with reference to the accompanying drawings:

A configuration of circuitry of a first embodiment of the present invention is shown in FIG. 1. A semiconductor memory device according to the present invention comprises: address judgment circuits 10 to 13; a redundancy judgment circuit 20; an address latch circuitry 30; redundancy word drivers 40 and 41; and a main word driver 50.

In the address judgment circuits 10 to 13, a defect address in the main memory cells are programmed, for example, using fuses, an address shown by address signals A0 to Aj, which are supplied from the outside is compared with the programmed address and results of the comparison are supplied to the redundancy judgment circuit 20 as judgment signals AC0 to AC2. In the following description, when a redundancy judgment result is coincidence between both addresses, a judgment signal is high, while, when the result is no coincidence, the judgment signal is low.

The address latch circuitry 30 includes as many latch circuits as the bit number of the address signal and is latched the address signals A0 to Aj in response to a clock signal CLK1, and an output, which is decoded by the address decoder 31, thereof is supplied to the main word line driver 50 as a selected address signal ASEL. The selected address signal ASEL of the present embodiment is generated from the address signals decoded by the address decoder 31 after received by address latch circuitry 30, however the selected address signal ASEL can be generated from the address signals latched by the address latch circuitry after decoded by the address decoder.

Then, the redundancy judgment circuit 20, which is provided in an initial state in which the main word driver 50, and redundancy word drivers 41 and 42 are held inactive, performs judgment on whether the main word line driver 50 is activated or the redundancy word drivers 40 or 41 are activated using the judgment results AC0 to AC3 output from the address judgment circuits 10 to 13. Outputs obtained as a result of the selection are supplied to the main word driver 50, and redundancy word drivers 40 and 41.

The main word driver 50 is controlled by a control signal XDC output from the redundancy judgment circuit 20 and the selected address signal ASEL output from the address latch circuitry 30.

Further, the redundancy word drivers 40 and 41 are respectively controlled by control signals RDC0 and RDC1 output from the redundancy judgment circuit 20. In the embodiment, the redundancy word driver 40 corresponds to a redundancy address programmed in the address judgment circuits 10 and 11 and the redundancy word driver 41 corresponding to a redundancy address programmed in the address judgment circuits 12 and 13. Redundancy word lines Red.Word0 and Red.Word1 have a sub-word structure, not shown, and actually, different word lines are selectively driven according to the judgment signals AC0 to AC3 in the redundancy word lines Red.Word0 and Red.Word1.

The redundancy judgment circuit 20 of FIG. 1 has a configuration as described below: A dynamic NOR circuit 21, at rise of the clock signal CLK1, receives the judgment signals AC0 and AC1 output from the address judgment circuits 10 and 11 and performs judgment. Likewise, the dynamic NOR circuit 22, at rise of the clock signal CLK1, receives the judgment signals AC2 and AC3 from the address judgment circuits 12 and 13 and performs judgment. Output signals from the dynamic NOR circuits 21 and 22 are buffered by inputting the signals to inverters 24 and 25. The dynamic AND circuit 23 receives outputs signals from the dynamic NOR circuits 21 and 22 at rise of the clock signal CLK2. The clock signal CLK2 is produced by delaying the clock signal CLK1 through a delay circuit 26 with a delay time $\Delta t$.

The redundancy word drivers 40 and 41 go into an activated state when the control signals RDC0 and RDC1 which are outputs from the inverters 24 and 25 are both high and respectively drive the redundancy word lines (Red.Word0, 1). The main word driver 50 drives a plurality of normal word lines and, when the control signal XDC is high, goes into an active state and drives a word line (Main Word) corresponding to an address shown by the selected address signal ASEL. The drivers 40, 41 and 50 are all in inactive states and none of word lines in connection are selected when the respective control signals are all low.

Figure 2:
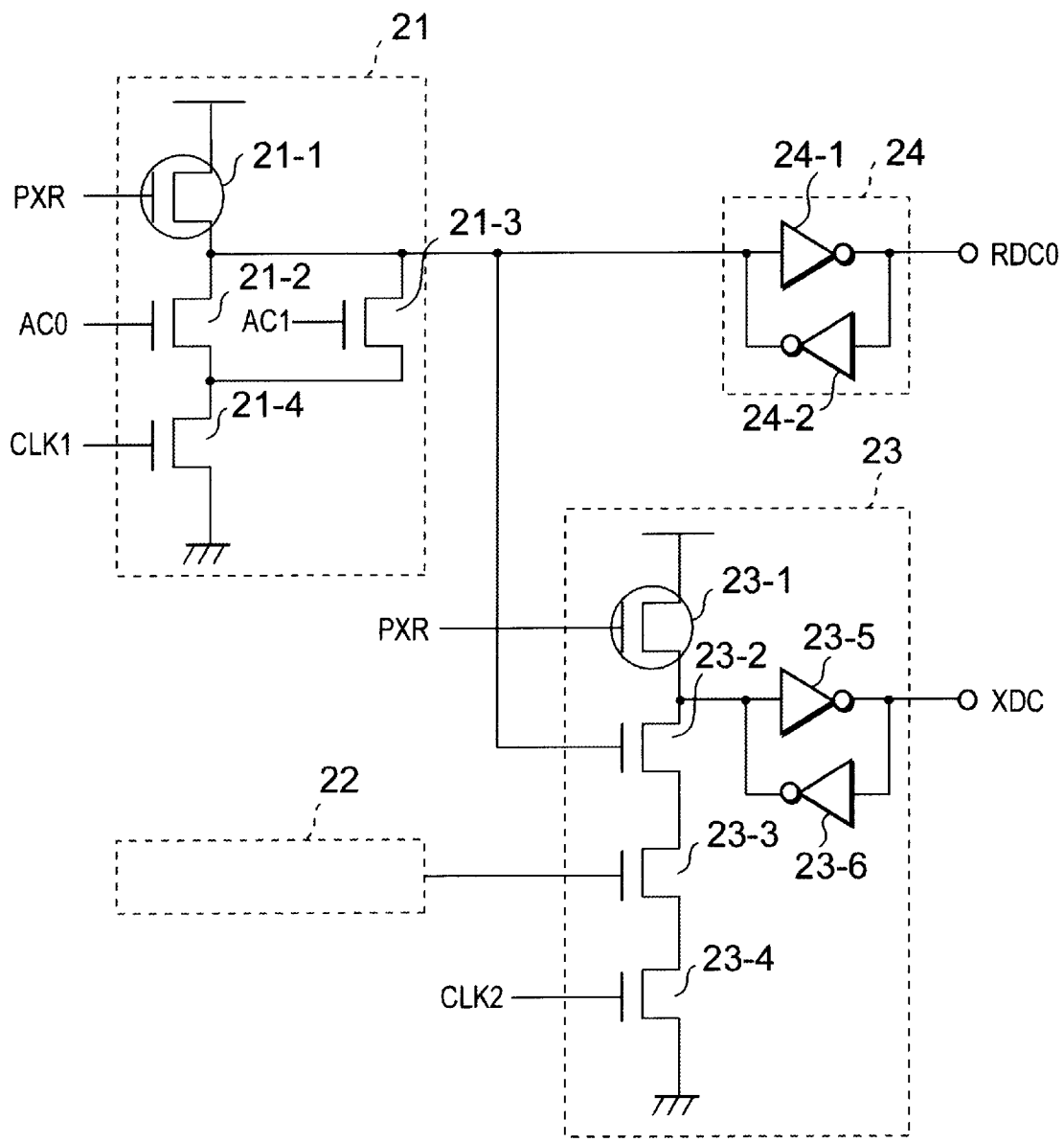
FIG. 2 is a diagram showing a configuration of a redundancy judgment circuit of the first embodiment of the present invention.

In FIG. 2, there is shown a detailed configuration of the redundancy judgment circuit 20. The dynamic NOR circuit 21 includes: a P channel MOS transistor (hereinafter referred to as PMOS) 21-1 that receives an initialization signal PXR at its gate; N channel MOS transistors (hereinafter referred to as NMOS) 21-2 and 21-3 that receive the judgment signals AC0 and AC1 at its gate; and an NMOS 21-4 that receives the clock signal CLK1 at its gate. Herein, the initialization signal PXR is low before execution of redundancy judgment and goes high when the judgment signals AC0 and AC1 are input. Therefore, the dynamic NOR circuit 21 outputs a high level signal in an initial state.

A signal output from the dynamic NOR circuit 21 is input to a buffer 24 configured by inverters 24-1 and 24-2 and thereafter, the control signal RDC0 is output from the buffer 24. Therefore, the control signal RDC0 is low in an initial state.

A configuration of the dynamic NOR circuit 22 is similar to that of the dynamic NOR circuit 21.

The dynamic AND circuit 23 includes: a PMOS 23-1 that receives the initialization signal PXR at its gate, while the dynamic NOR circuit 21 also receives the initialization signal PXR; an NMOS 23-2 that receives an output from the dynamic NOR circuit 21 at its gate; an NMOS 23-3 that receives an output from the dynamic NOR circuit 22 at its gate; an NMOS 23-4 that receives the clock signal CLK2 at its gate; and inverters 23-5 and 23-6. Therefore, the dynamic AND circuit 23 outputs the control signal XDC at a low level in an initial state.

Description will below be made of operations of the embodiment using the circuit configuration diagram of FIG. 1 and a timing chart of FIG. 3:

First, operations of the address judgment circuits 10 to 13 will be described. In the address judgment circuits 10 to 13, the initialization signal PXR is low and the judgment signals AC0 to AC3 are high before an address complementary signal A0N/T, A1N/T . . . AjN/T is given from the outside. The initialization signal PXR goes high after the address complementary signal A0N/T, A1N/T . . . AjN/T is input and before the clock signal CLK1 rises.

For example, in the address judgment circuit 10, the address complementary signal A0N/T, A1N/T . . . AjN/T is compared with a redundancy address programmed by fusing fuses and, when in coincidence, a charge of the judgment signal AC0 is not extracted to remain high (a solid line of AC0 of FIG. 3), while, not in coincidence, the charge of the judgment signal AC0 is extracted to go low (a broken line of AC0 of FIG. 3). Likewise, in the address judgment circuits 11 to 13 as well, comparison between addresses is conducted and results are output as the judgment signals AC1 to AC3.

Initial states of the control signals RDC0, RDC1 and XDC output from the redundancy judgment circuit 20 are all low as described above.

First, the judgment signals AC0 to AC3 output from the address judgment circuits 10 to 13 are input to the dynamic NOR circuits 21 and 22 in the redundancy judgment circuit 20, two signals for one circuit. The dynamic NOR circuits 21 an 22 receive values of the judgment signals AC0 to AC3 in response to the clock signal CLK1 that is provided in a predetermined timing and output signals that each determine whether or not a redundancy word line is used.

Further, output signals from the dynamic NOR circuits 21 and 22 are input to the dynamic AND circuit 23 and judgment is performed on whether or not a main word line is used at a time point when the clock signal CLK2 produced by delaying the clock signal CLK1 by $\Delta t$ is input.

Herein, in the present invention, the delay time $\Delta t$ is set based on the timings in which levels of the control signals RDC0 and RDC1 are determined. That is, the $\Delta t$ is only required to be set to a time between rise of the clock signal CLK1 and determination of the levels of the control signals RDC0 and RDC1. The $\Delta t$ is preferably set to a time increased by adding a margin of malfunction thereto.

When the judgment signal AC0 is high and the other judgment signals AC1 to AC3 are low, since an output from the dynamic NOR circuit 21 goes low in response to the clock signal CLK1, the control signal RDC0 goes high and is input to the redundancy word driver 40. Further, since the dynamic NOR circuit 22 outputs at a high level in response to the clock signal CLK1, the control signal RDC1 goes low and is input to the redundancy word driver 41.

Figure 3:
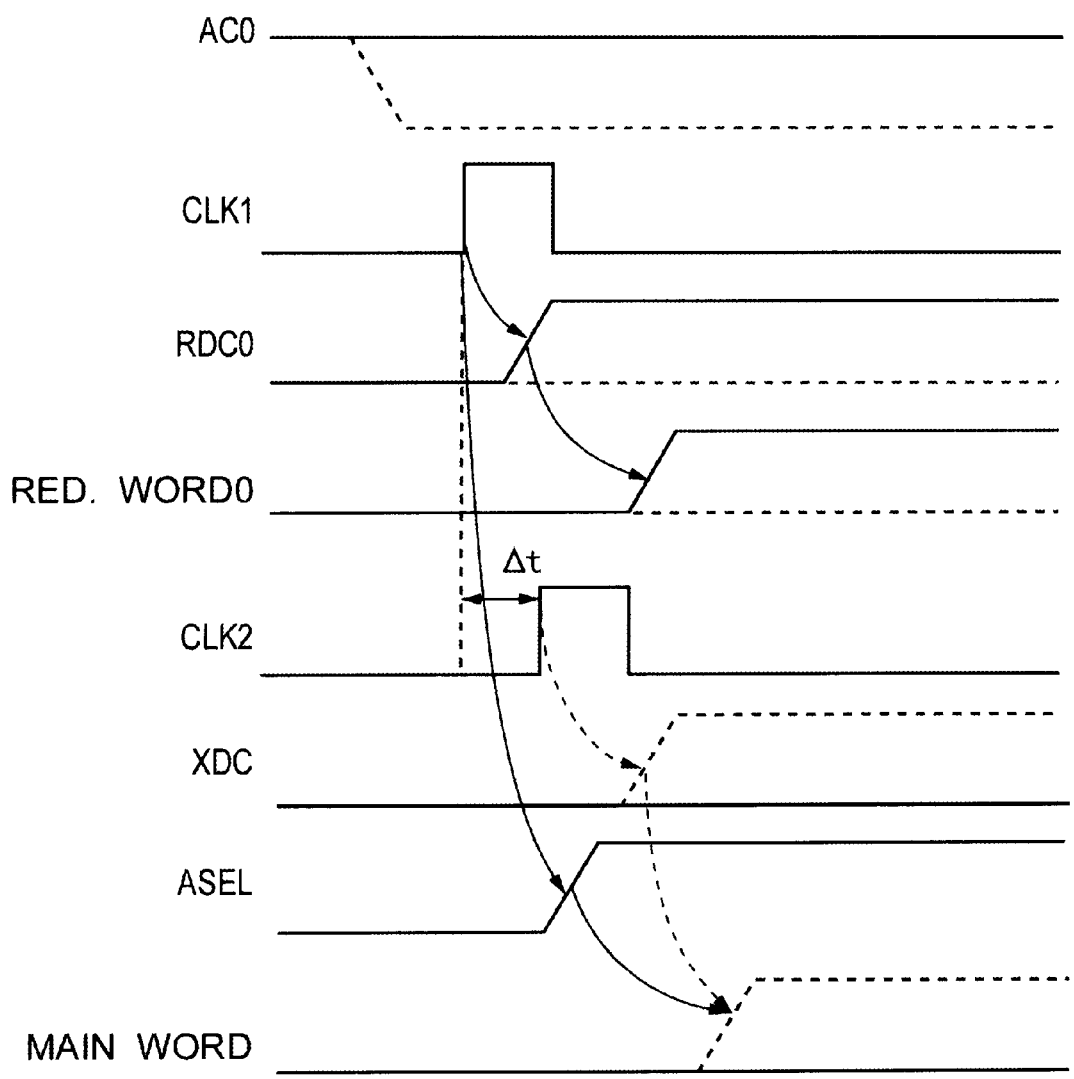
FIG. 3 is a timing chart showing operations of the first embodiment of the present invention.

Output signals from the dynamic NOR circuits 21 and 22 are received by the dynamic AND circuit 23 in response to the clock signal CLK2 and the control signal XDC is supplied to the main word driver 50, while remaining low (a solid line of XDC of FIG. 3).

On the other hand, when all the judgment signals AC0 to AC3 are low, outputs from the dynamic NOR circuits 21 and 22 remain high. The control signals RDC0 and RDC1 are input to the redundancy word drivers 40 and 41, while both remaining low. Output signals from the dynamic NOR circuits 21 and 22 are received by the dynamic AND circuit 23 in response to the clock signal CLK2 and the control signal XDC goes high and is supplied to the main word driver 50 (a broken line of XDC of FIG. 3).

The address latch circuit 30 latches the address signals A0 to Aj that are supplied from the outside, in response to the clock signal CLK1 and outputs the selected address signal ASEL to the main word driver 50. This shows that the selected address signal ASEL can be generated without waiting for a judgment result.

The main word driver 50 does not drive a main word line Main Word when the control signal XDC is low (a solid line of Main Word of FIG. 3), but drives a main word line Main Word that corresponds to address information shown by the selected address signal ASEL when the control signal XDC is high (a broken line of Main Word of FIG. 3).

The redundancy word drivers 40 and 41 perform high level output onto redundancy word lines when the control signals RDC output from the redundancy judgment circuit 20 are high (a solid line of Red.Word of FIG. 3), while, when the control signals RDC are low, leaving redundancy word lines Red.Word at low levels (a broken line of Red.Word of FIG. 3).

In such a way, since the control signal XDC is low in an initial state, as shown in signal waveforms depicted with solid lines of FIG. 3 when the judgment signal AC0 is high wherein addresses shows coincidence in comparison, a main word line (Main Word) is never driven even if the selected address signal ASEL is input to the main word line driver 50, prior to rise in redundancy word line Red.Word0.

Figure 4:
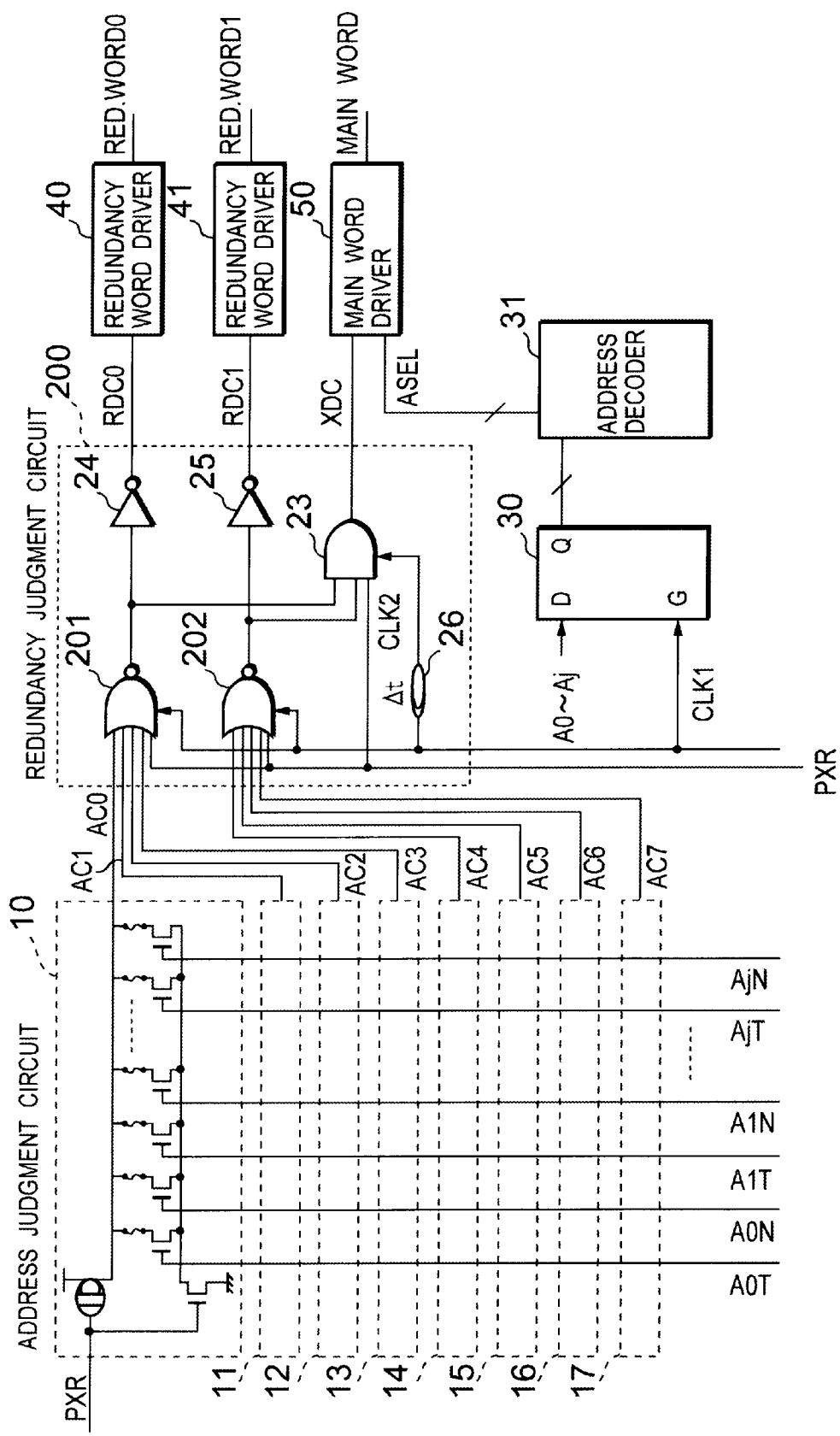
FIG. 4 is a diagram showing a configuration of circuitry of a second embodiment of the present invention.
Figure 5:
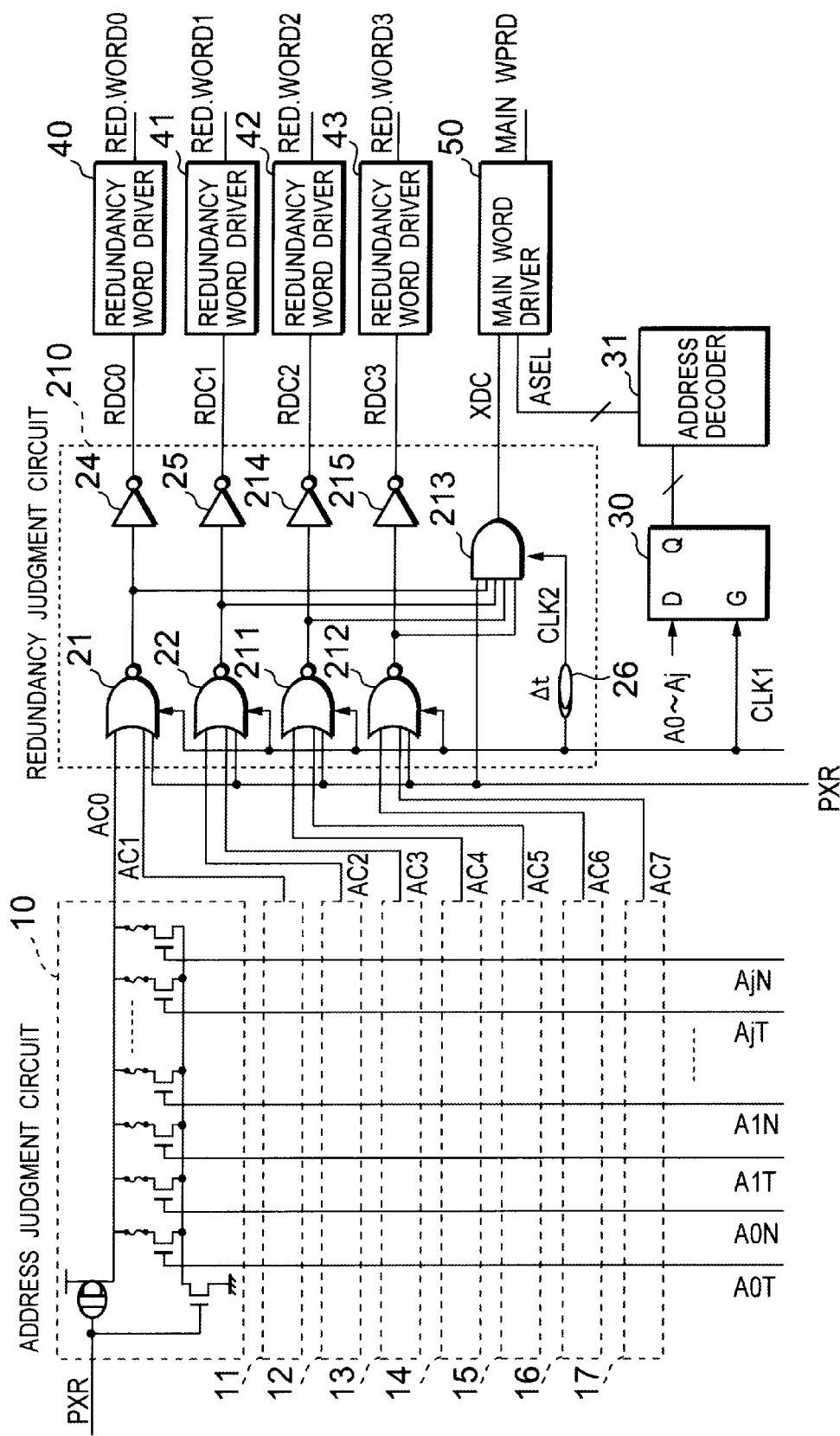
FIG. 5 is a diagram showing a configuration of circuitry of a third embodiment of the present invention.

Below, second and third embodiments of the present invention in which the number of redundancy addresses is increased will be shown in FIGS. 4 and 5. In FIGS. 4 and 5, the same constituents in the embodiments as those of FIG. 1 are indicated by the same numerical marks and descriptions thereof are omitted.

In order to cope with many of defects in normal memory cells, address judgment circuits is increased in number. In the embodiment, when the address judgment circuits are increased in number, measures are thought of in two ways: Firstly, the number of inputs to dynamic NOR circuits is increased according to increase in the circuits as shown in FIG. 4, or secondly, dynamic NOR circuits are increased in number and as many input terminals to a dynamic AND circuit are provided in correspondence to the increase in the number of the dynamic NOR circuits as shown in FIG. 5.

In FIG. 4, eight address judgment circuits 10 to 17 are provided. In a redundancy judgment circuit 200, control signals AC0 to AC3 are input to a dynamic NOR circuit 201 and judgment signals AC4 to AC7 are input to a dynamic NOR circuit 202. While in the embodiment, the number of inputs to the dynamic NOR circuits increases, since, even if the number of inputs increases, transistors that receive judgment signals AC are in parallel connected, the generation timing of output signals is affected only to a small extent by the increase. Further, since the dynamic AND circuit 23 may be of two inputs in the same way as that in the first embodiment, the timing to generate the control signal XDC is almost not different from the first embodiment.

Figure 9:
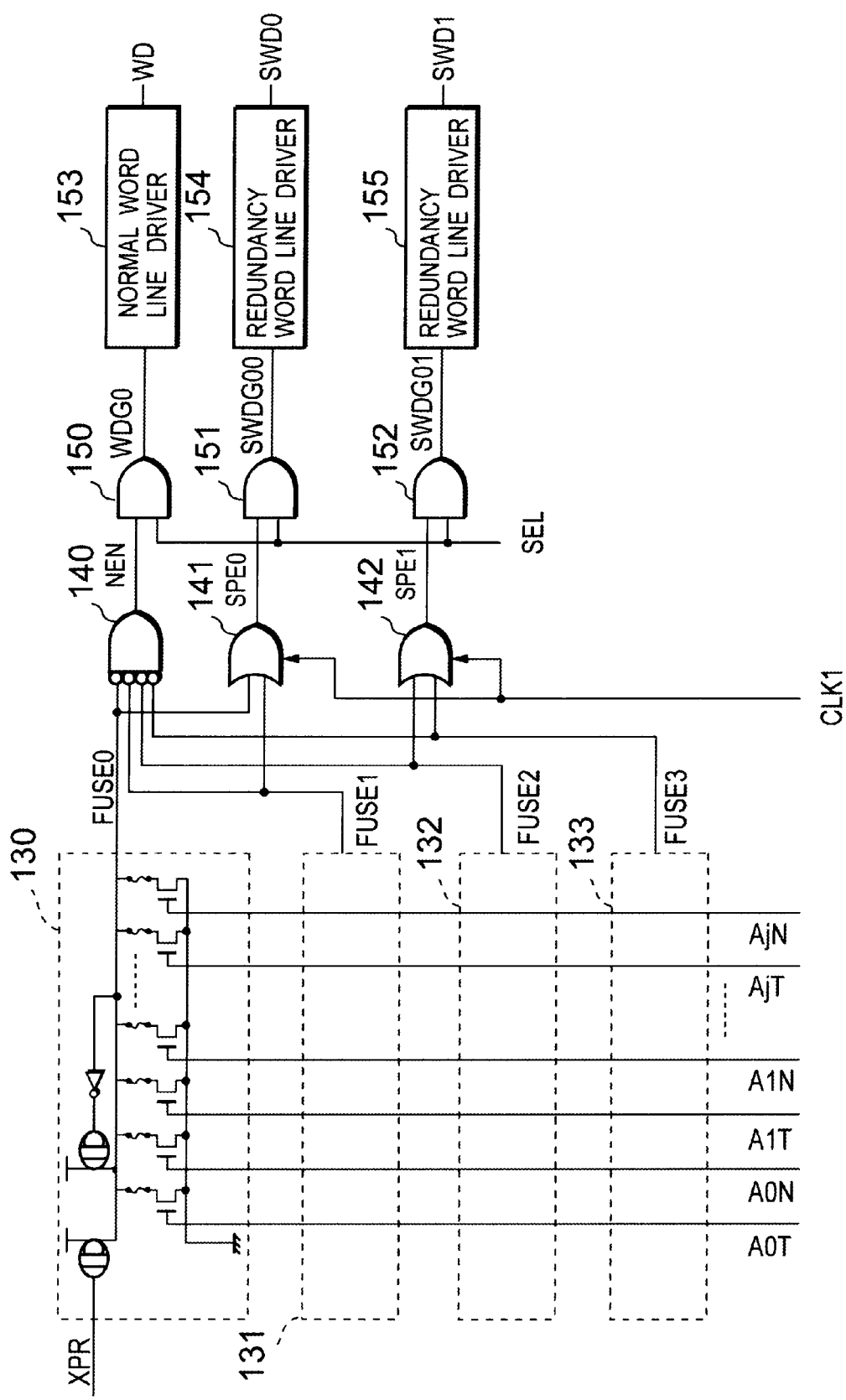
FIG. 9 is a diagram showing a configuration of circuitry of another conventional technique relating to the present invention.

In FIG. 5, two control signals AC are input to each of the dynamic NOR circuits 21, 22, 211 and 212. Hence, the timing in which the control signals RDC0 to RDC3 are output is same as that of the first embodiment. In the embodiment, the number of inputs to the dynamic AND circuit 213 that outputs the control signal XDC is 4. Judging from comparison of the conventional technique shown in FIG. 9, the number of inputs of the AND circuit 140 of the conventional technique should be 8 instead of 4. Therefore, according to the embodiment, even when redundancy addresses increase in number, the timing to generate control signals XDC is affected a little.

In this way, according to the second and third embodiments, the number of redundancy addresses can be increased with no increase in time required for selecting a redundancy word driver or a main word driver.

Figure 6:
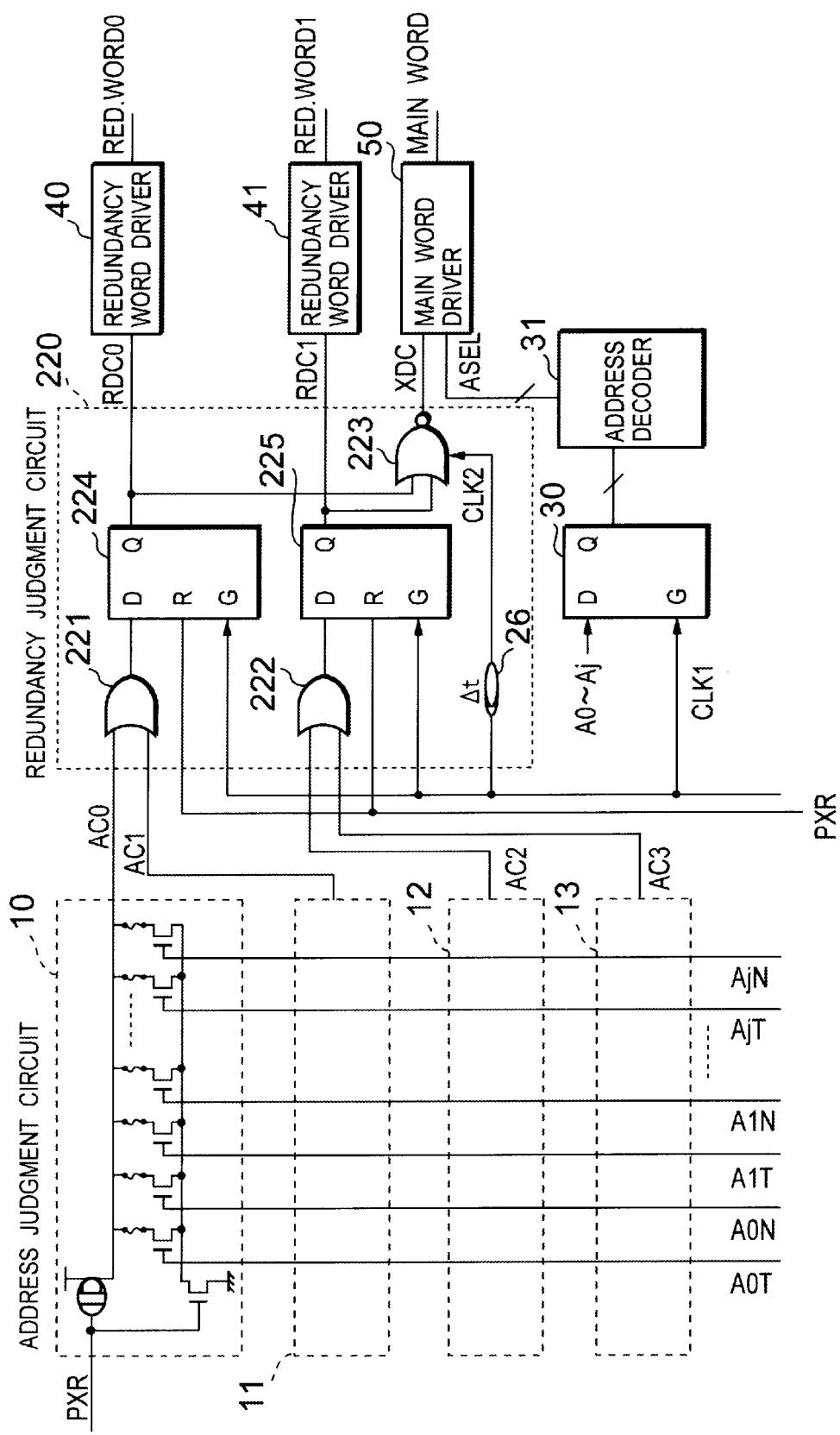
FIG. 6 is a diagram showing a configuration of circuitry of a fourth embodiment of the present invention.
Figure 7:
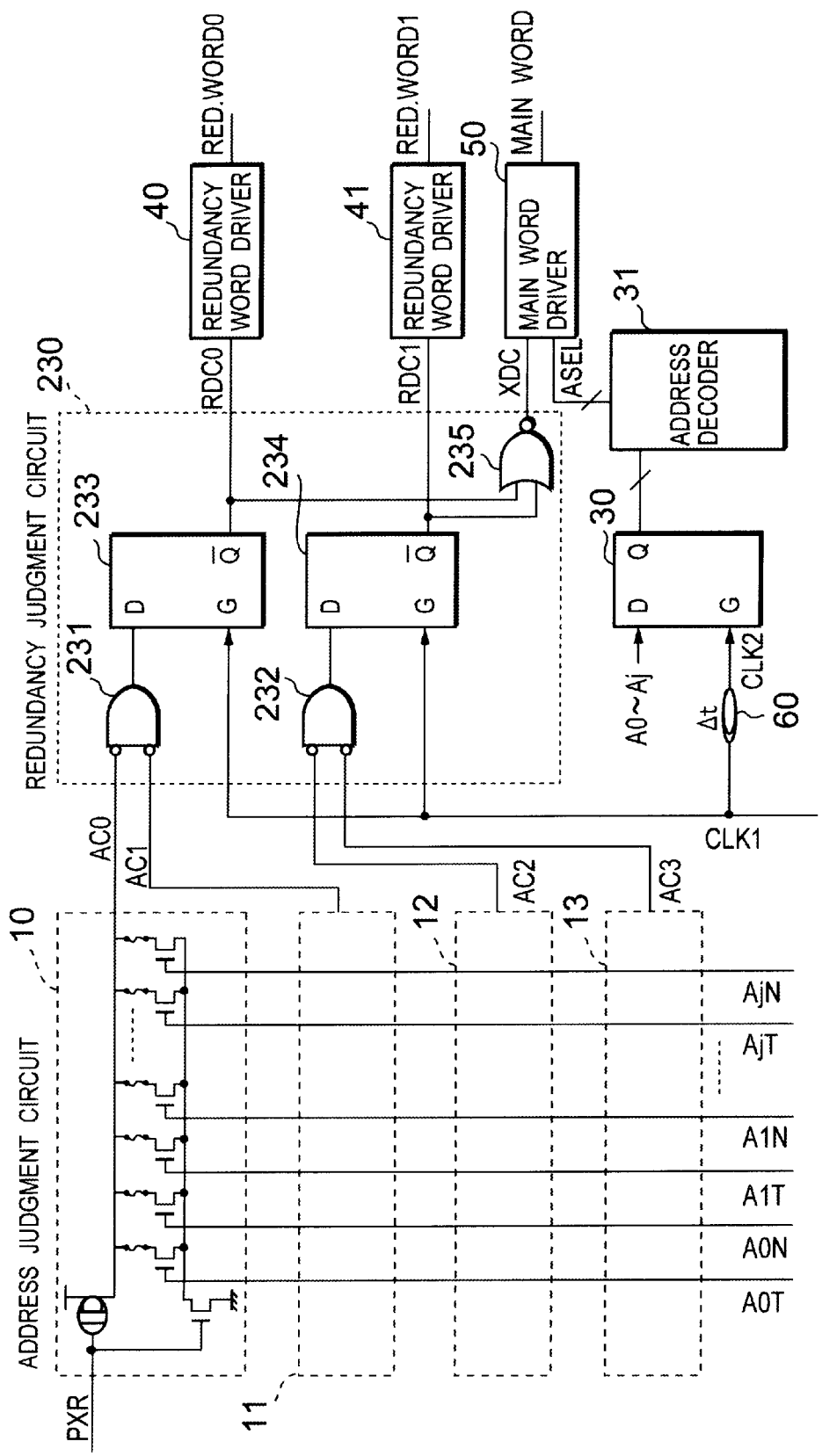
FIG. 7 is a diagram showing a configuration of circuitry of a conventional technique relating to the present invention.
Figure 8:
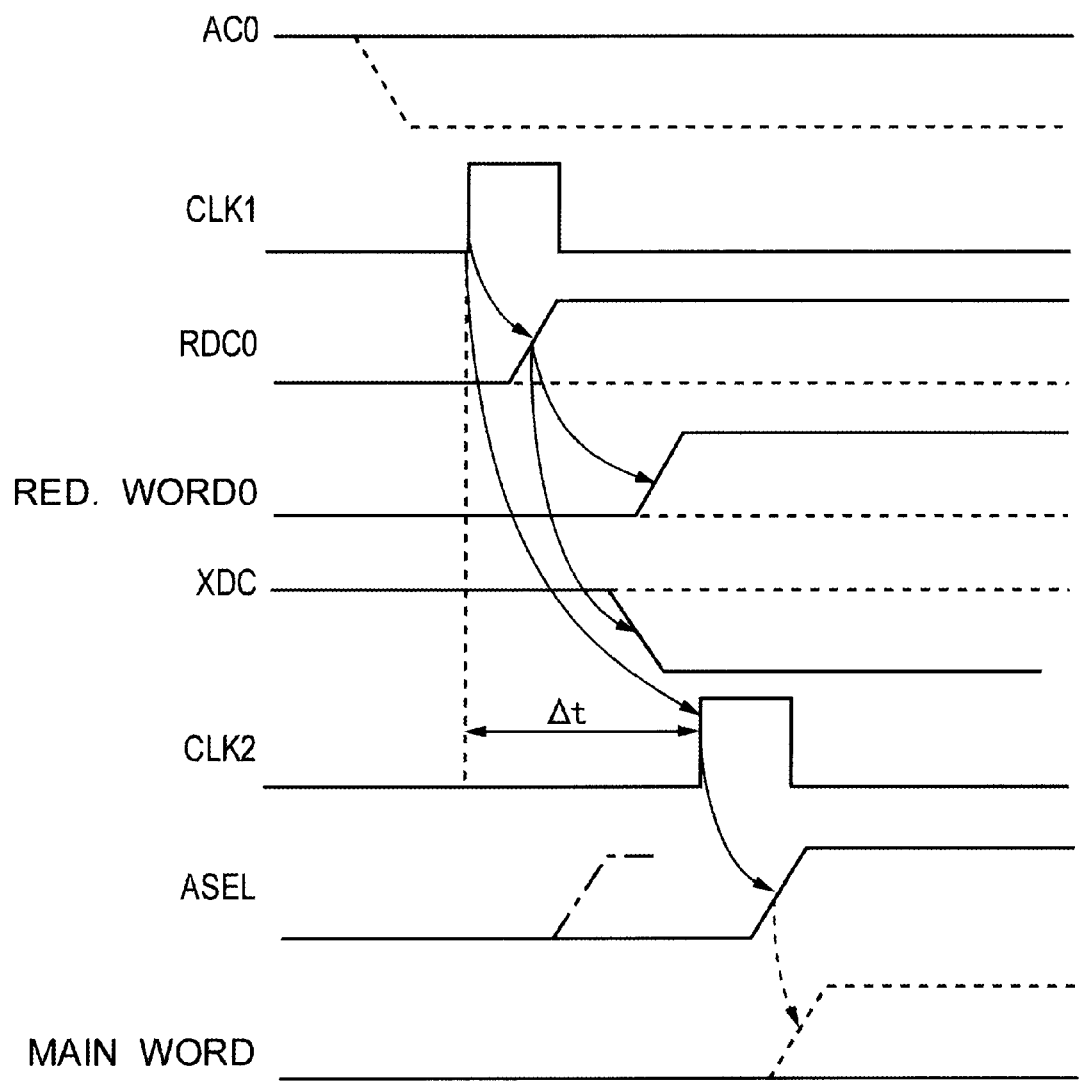
FIG. 8 is a timing chart showing operation of the conventional technique relating to the present invention.

Next, a fourth embodiment is shown in FIG. 6. In the embodiment, a redundancy judgment circuit 220 includes: an OR circuit 221 to which control signals AC0 and AC1 are input; an OR circuit 222 to which control signals AC2 and AC3 are input; a latch circuit 224 that latches an output from the OR circuit 221 at rise of a clock signal CLK1; a latch circuit 225 that latches an output from the OR circuit 222 at rise of the clock signal CLK1; a delay circuit 26 that delays the clock signal CLK1; and a dynamic NOR circuit 223 to which outputs from the latch circuits 224 and 225 are input, and which operates in response to a clock signal CLK2.

Note that in initial states, outputs (control signals RDC0 and RDC1) from the latch circuits 224 and 225 are low and an output (a control signal XDC) from the dynamic OR circuit 223 is also low.

In the above described embodiments, after the clock signal CLK1 rises, (1) a dynamic NOR circuit is activated, (2) an input of a dynamic AND circuit is determined and (3) then the dynamic AND circuit is activated.

On the other hand, in the embodiment, since outputs from the OR circuits 221 and 222 are determined before the clock signal CLK1 rises, a processing time required after the rise of the clock signal CLK1 is less than in the first to third embodiments. That is, in the embodiment, after the clock signal CLK1 rises, (1) an input to the dynamic OR circuit 223 is determined (, outputs from the OR circuits 221 and 222 are latched in the latch circuits 224 and 225) and then (2) the dynamic OR circuit 223 is operated.

Further, according to the embodiment, since a delay time Δt is less than in the first to third embodiments, a circuit scale of the delay circuit 26 can be smaller.

A first advantage of the present invention is that a rise time of a word line corresponding to an address can be short.

The reason why is that since a control signal to activate a main word driver is set to be inactive in an initial state of an address judgment circuit, an address signal that is supplied to a main word driver is not necessary to be delayed till no driving of a redundancy word line (Red.Word) is determined. That is, regardless of a judgment result, an address signal that should be given to a main word driver can be generated in advance and a rise time of a main word line is shortened in correspondence to the saved time due to in-advance generation of the address signal.

A second advantage is that even when the number of redundancy addresses increases, a operating speed is not reduced.

The reason why is that since in redundancy judgment, first, it is judged whether a redundancy word line is active or inactive and it is further judged, based on the judgment result on the redundancy word line, whether or not a main word line is active or inactive, therefore, a ratio of increase in the number of inputs to judgment circuits such as a dynamic NOR circuit and a dynamic AND circuit, to increase in the number of redundancy addresses (increase in the number of judgment signals AC) is small. That is, because there is no requirement for concentration of a processing load in one circuit. Further, since control of activation or deactivation of main word line and redundancy word line is not performed separately, there can be enjoyed an advantage that a scale of the entire circuitry can be small.

While preferred embodiments of the present invention have been described, it is to be understood that the invention is to be defined by the appended claims when read in light of the specification and when accorded their full range of equivalent.

What is claimed is:

1. A semiconductor memory device comprising:
   a plurality of normal memory cells;
   a plurality of redundancy memory cells provided for defect relief in the normal memory cells;
   a main word driver that drives a normal word line to select said plurality normal memory cells, when in an active state;
   a redundancy word driver that drives a redundancy word line to select said plurality of redundancy memory cells, when in an active state; and
   a redundancy judgment circuit that judges whether or not an address signal input is of a defect address in said plurality of normal memory cells and, when the address signal is of the defect address, places the redundancy word driver in the active state without placing the main word driver in the active state, while, when the address signal is not of the defect address, placing the main word driver in the active state without placing the redundancy word driver in the active state,
   wherein, said redundancy judgment circuit places both the redundancy word driver and the main word driver in the respective inactive states in an initial state before the address signal is input to the redundancy judgment circuit, and said main word driver is supplied with said address signal whether said address signal is said defect address or not.

2. A semiconductor memory device comprising main memory cells that are normally used and redundancy memory cells for defect relief in the main memory cells, including:
   a main word driver that receives a first control signal and, when the first control signal is at a first level, selects the main memory cell, while, when the first control signal is at a second level, not selecting the main memory cell;
   a redundancy word driver that receives said second control signal and, when the second control signal is at a first level, selects the redundancy memory cell, while, when said second control signal is at said second level, not selecting the redundancy memory cell;
   an address judgment circuit that when an address signal is input and address information shown by the address signal coincides with an address of the redundancy memory cell, outputs a judgment signal at said first level, while in no coincidence, outputting a judgment signal at said second level; and
   a redundancy judgment circuit that receives said judgment signal and, when the judgment signal is at said first level, sets said second control signal to said first level, while, when the judgment signal is at said second level, setting said second control signal to said second level,
   wherein before said redundancy judgment circuit receives the judgment signal from said address judgment circuit, said redundancy judgment circuit sets said first and second control signals to respective said second levels.

3. The semiconductor memory device according to claim 2, wherein said redundancy judgment circuit includes:
   a dynamic OR circuit that receives said judgment signal and a first clock signal and, when the first clock signal is input to the dynamic OR circuit, outputs said second control signal; and
   a dynamic AND circuit that receives an output of the dynamic OR circuit and a second clock signal produced by delaying the first clock signal by said predetermined time and, when the second clock signal is input to the dynamic AND circuit, outputs the first control signal.

4. The semiconductor memory device according to claim 3, wherein said predetermined time is set longer than a period for which said dynamic OR circuit outputs in response to said judgment signal, and shorter than a period for which said redundancy word driver is transformed an inactive state into an active state.

5. The semiconductor memory device according to claim 2, wherein said redundancy judgment circuit includes: a first OR circuit that receives said judgment signal; a latch circuit that receives an output signal from the first OR circuit and said first clock signal and, when said first clock signal is input to the latch circuit, latches the output signal of the first OR circuit and outputs said second control signal; and a second OR circuit that receives said second control signal and said second clock signal produced by delaying the first clock signal by a predetermined time and, when said second clock signal is input to the second OR circuit, outputs said first control signal.

6. The semiconductor memory device according to claim 3, wherein said second clock signal is delayed from said first clock signal by a time from a point at which a level of said first clock signal changes, to a point till which a level of said second control signal is determined.

7. The semiconductor memory device according to claim 2, wherein more than one of said address judgment circuit are provided, more than one of a dynamic OR circuit that respectively receive a plurality of judgment signals output from the more than one of said address judgment circuit are provided instead of the dynamic OR circuit and a dynamic AND circuit receives outputs from the more than one of the dynamic OR circuit without no other dynamic AND circuit provided.

8. The semiconductor memory device according to claim 3, wherein an address latch circuit that receives the address signal in response to said first clock signal.

9. A semiconductor memory device comprising:
   a main word driver receiving an address signal and a main word select signal, and driving a main word line according to said address signal and said main word select signal;
   a redundancy word driver receiving a redundancy word select signal and driving a redundancy word line according to said redundancy word select signal; and
   a redundancy judgment circuit receiving a defect address judgment signal and a reset signal, and outputting said main word select signal and said redundancy word select signal;

wherein said redundancy judgment circuit initializes said main word select signal and said redundancy word select signal to inactive states when said reset signal is in active state, activates said redundancy word select signal when said defect address judgment signal becomes active, and activates said main word select signal when said redundancy word select has kept in inactive state for a predetermined period.

10. The semiconductor memory device as claimed in claim 9, further comprising:

an address judgment circuit comparing said address signal with an defect address programmed with a plurality of fuses, and outputting said defect address judgment signal.

11. The semiconductor memory device according to claim 9, wherein said redundancy judgment circuit includes a dynamic OR circuit receiving said defect address judgment signal and said reset signal and outputting said redundancy word select signal in response to a first control signal, and a dynamic AND circuit receiving output of said dynamic OR circuit and said reset signal and outputting said main word select signal in response to a second control signal.

12. The semiconductor memory device according to claim 11, wherein said second control signal is delayed from said first control signal by a predetermined period.

13. The semiconductor memory device according to claim 9, wherein said redundancy judgment circuit includes a OR circuit receiving said defect address judgment signal, a latch circuit receiving said OR circuit output signal and said reset signal in response to first control signal, a dynamic NOR circuit receiving said latch circuit output in response to a second control signal, said OR circuit output is said redundancy word select signal and said latch circuit output is said main word select signal.

* * * * *